(12) United States Patent
Yu

(10) Patent No.: US 8,656,003 B2
(45) Date of Patent: Feb. 18, 2014

(54) METHOD FOR CONTROLLING RACK SYSTEM USING RMC TO DETERMINE TYPE OF NODE BASED ON FRU'S MESSAGE WHEN STATUS OF CHASSIS IS CHANGED

(75) Inventor: Lin Yu, Shanghai (CN)

(73) Assignee: Inventec Corporation, Taipei (TW)

( * ) Notice: Subject to any disclaimer, the term of this patent is extended or adjusted under 35 U.S.C. 154(b) by 158 days.

(21) Appl. No.: 13/412,627

(22) Filed: Mar. 6, 2012

(65) Prior Publication Data

US 2013/0110926 A1 May 2, 2013

(30) Foreign Application Priority Data

Oct. 28, 2011 (CN) .......................... 2011 1 0335298

(51) Int. Cl.
*G06F 15/173* (2006.01)
(52) U.S. Cl.
USPC .............................. 709/223; 709/224; 710/15
(58) Field of Classification Search
USPC .............. 709/223, 224, 220; 710/15; 700/275
See application file for complete search history.

(56) References Cited

U.S. PATENT DOCUMENTS

| 2003/0065751 | A1* | 4/2003 | Autor et al. ................... 709/220 |
| 2009/0031051 | A1* | 1/2009 | Nguyen ......................... 710/15 |
| 2010/0125653 | A1* | 5/2010 | Cherian et al. ................ 709/223 |
| 2012/0136484 | A1* | 5/2012 | Wang et al. ................... 700/275 |
| 2012/0317265 | A1* | 12/2012 | Das et al. ...................... 709/224 |
| 2012/0331119 | A1* | 12/2012 | Bose et al. .................... 709/223 |
| 2013/0110926 | A1* | 5/2013 | Yu ................................. 709/204 |

* cited by examiner

*Primary Examiner* — Le H Luu
(74) *Attorney, Agent, or Firm* — CKC & Partners Co., Ltd.

(57) ABSTRACT

A method for controlling a rack system including a plurality of detachable chassis, where at lease one node is disposed in the chassis and a rack management controller (RMC) is disposed in the rack system. First, at least one detecting unit connected to the RMC and the node of the chassis in the rack system is provided. Next, a status message of the chassis is detected for determining whether the status of the chassis is changed. When the status is changed, the detecting unit determines whether the node corresponding to the chassis exists in the rack system. When the node exists, the detecting unit acquires a message of a field replaceable unit (FRU) of the node. Thereafter, the detecting unit transmits the message of the FRU to the RMC. Then, the RMC determines a type of the node according to the message of the FRU.

10 Claims, 7 Drawing Sheets

METHOD FOR CONTROLLING RACK SYSTEM USING RMC TO DETERMINE TYPE OF NODE BASED ON FRU'S MESSAGE WHEN STATUS OF CHASSIS IS CHANGED

RELATED APPLICATIONS

This application claims priority to China Application Serial Number 201110335298.8, filed Oct. 28, 2011, which is herein incorporated by reference.

BACKGROUND

1. Technical Field

The present disclosure relates to a method for controlling an electronic device, and more particularly to a method for controlling a rack system.

2. Description of Related Art

In cloud computing, a rack system having a plurality of slots is adopted, and a Rack Management Controller (RMC) is disposed therein, so as to manage and control the rack system. Moreover, the slots in the rack system allow a chassis to be inserted, and different chassis or the same chassis may have nodes with different functions, such as a Local Area Network (LAN) switch, a motherboard (or called server board) and a Just a Bunch of Disks (JBOD) (or referred to as a hard driver).

However, the node boards with different functions in the rack system may have different power consumption, and in a conventional rack management controlling manner, an RMC actively inquires a message of each node in a rack system in periodically, but the RMC cannot obtain the type and the power consumption information of a newly inserted node motherboard in real time. Therefore, it is difficult for the RMC to precisely control the on and off of the newly inserted node in real time according to the power consumption information of the node and the maximal load of the power supply of the rack system. If multiple motherboards with high power consumption are turned on for operation simultaneously, the total power consumption of the rack system may exceed the maximal load of the power supply thereof, thus resulting in a phenomenon of unstable power supply. Moreover, a great amount of heat energy generated by a motherboard node with high power consumption may cause a heat sink device of the rack system to fail to smoothly dissipate the heat energy, thus resulting a failure of the rack system.

Therefore, the conventional skill still has the aforementioned defects and deficiencies needing to be solved.

SUMMARY

The present disclosure discloses a method for a controlling rack system, applied to a rack system including a plurality of detachable chassis, where at lease one node is disposed in the chassis and an RMC is disposed in the rack system. The controlling method includes the following steps. At least one detecting unit connected to the RMC and the node of the chassis in the rack system is provided. Next, a status message of the chassis is detected for determining whether the status of the chassis is changed. When the status is changed, the detecting unit determines whether the node corresponding to the chassis exists in the rack system according to the status message of the chassis. When the node exists, the detecting unit acquires a message of a field replaceable unit (FRU) of the node. Thereafter, the detecting unit transmits the message of the FRU to the RMC. Then, the RMC determines a type of the node according to the message of the FRU.

According to an embodiment of the present disclosure, the controlling method for a rack system further includes the following steps. The RMC transmits the type of the node to the detecting unit. Next, the detecting unit performs a sensor reading procedure of the node according to the type of the node, and transmits a sensor read value to the RMC. Thereafter, the RMC performs power management and temperature controlling on the rack system according to the type of the node and the sensor read value.

According to an embodiment of the present disclosure, the type of the node includes at least one of an LAN switch, a JBOD and a motherboard, the JBOD includes a processor, and the motherboard includes a Baseboard Management Controller (BMC).

According to an embodiment of the present disclosure, the step of acquiring the message of the FRU of the node includes the following steps. The detecting unit detects whether the node includes the processor or the BMC through a node_type_GPIO (General Purpose I/O) port. When the node does not include the processor or the BMC, the detecting unit acquires the message of the FRU of the node through a master_write_read command. When the node includes the processor or the BMC, the detecting unit acquires the message of the FRU of the node through a read_FRU_data command.

According to an embodiment of the present disclosure, the sensor reading procedure of the node includes the following steps. When the type of the node is the LAN switch, the detecting unit acquires a sensor read value of the LAN switch through the master_write_read command. When the type of the node is the JBOD, the detecting unit acquires a sensor read value of the JBOD through an Intelligent Platform Management Interface (IPMI). When the type of the node is the motherboard, the detecting unit acquires a sensor read value of the motherboard through the IPMI. Then, the sensor read value of the node is stored in the detecting unit.

According to an embodiment of the present disclosure, the step of transmitting the type of the node to the detecting unit includes the following step. The detecting unit is informed of the type of the node and of a sensor reading method of the node through a node type command.

According to an embodiment of the present disclosure, the transmitting the sensor read value to the RMC includes the following step. A sensor reading command is provided to the RMC, so as to acquire the sensor read value of the node stored in the detecting unit.

According to an embodiment of the present disclosure, the performing the power management and the temperature controlling on the rack system includes the following steps. When the type of the node is the motherboard, the detecting unit acquires version messages of the BMC, a basic input/output system and a complex programmable logic device of the motherboard. Next, the detecting unit provides a version message corresponding to the motherboard to the RMC. When the type of the node is the LAN switch or the JBOD, the detecting unit directly provides power consumption information of the LAN switch or the JBOD to the RMC.

According to an embodiment of the present disclosure, the step of performing the power management and the temperature controlling on the rack system further includes the following steps. An enabling signal of the node is detected. Then, power matching calculation is executed according to the enabling signal of the node, so as to perform statistics on total power consumption of the nodes. Thereafter, a step is performed to determine whether the total power consumption is larger than a preset power value. When the total power consumption is larger than the preset power value, the number of nodes activated is controlled and a load of a power supply is maintained, so as to perform the power management on the rack system.

According to an embodiment of the present disclosure, the RMC controls a fan rotation speed or activates a heat sink device according to generated heat energy corresponding to the number of the nodes activated, so as to regulate a temperature of the rack system.

Therefore, the advantages of applying the present disclosure lie in that, the detecting unit detects and determines a status message and a sensor read value of a newly added node in the rack system, so that the RMC may determine the type of the node in real time and correspondingly perform power matching calculation, so as to perform power consumption statistics and power distribution on all nodes in the rack system, and execute corresponding temperature regulation according to generated heat energy corresponding to nodes activated, thereby achieving the foregoing objectives.

BRIEF DESCRIPTION OF THE DRAWINGS

In order to make the aforementioned and other objectives, features, advantages and embodiments of the present disclosure more comprehensible, the accompanying drawings are illustrated as follows.

DETAILED DESCRIPTION

The spirit of the present disclosure is illustrated clearly below with reference to drawings and detailed description, persons having ordinary skill in the art, after understanding exemplary embodiments of the present disclosure, may make changes and modifications through technologies taught in the present disclosure, and the changes and modifications do not depart from the spirit and the scope of the present disclosure.

Figure 1:
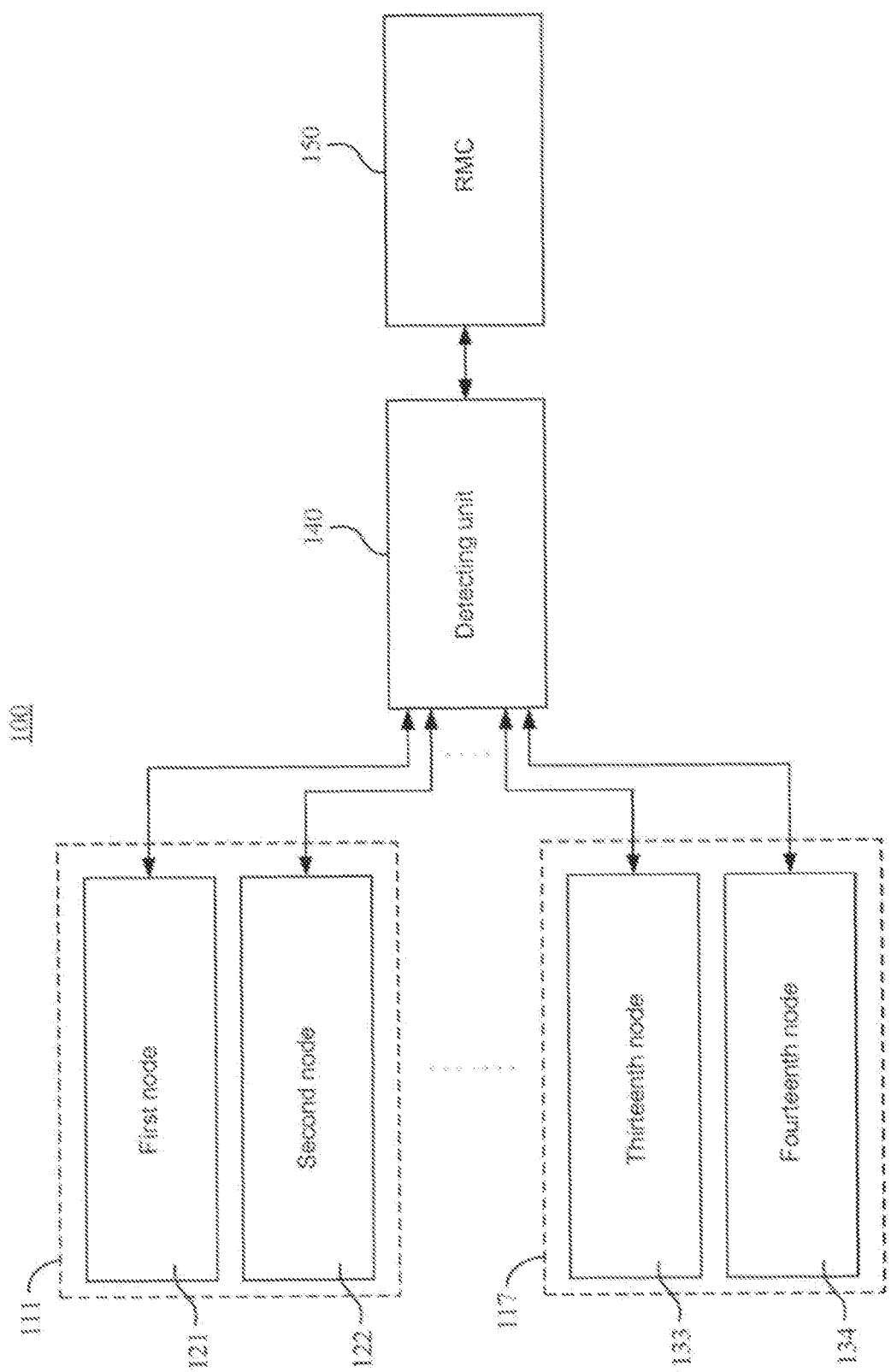
FIG. 1 is a schematic circuit block diagram of a rack system according to an embodiment of the present disclosure.

FIG. 1 is a schematic circuit block diagram of a rack system 100 according to an embodiment of the present disclosure. Practically, the rack system 100 is applicable to a server or other similar devices but is not limited thereto. As shown in FIG. 1, the rack system 100 may include several chassis from a first chassis 111 to a seventh chassis 117 which are detachable, a detecting unit 140 and an RMC 150, in which the detecting unit 140 is electrically coupled to the first chassis 111 to the seventh chassis 117, and the RMC 150 is electrically coupled to the detecting unit 140.

In this embodiment, each chassis may include two nodes, and therefore the rack system 100 may include fourteen nodes, such as from a first node 121 to a fourteenth node 134. The node may be any one of an LAN switch, a JBOD and a motherboard. The detecting unit 140 may be respectively coupled to the fourteen nodes through an $I^2C$ (inter-integrated circuit) switch (not shown), and acquire up-to-date status messages of the nodes 121-134 (from the first node 121 to the fourteenth node 134) through an IPMI (Intelligent Platform Management Interface) or by adopting a master_write_read command. For example, information about whether the node exists and information about the FRU of the node are acquired. Then, the detecting unit 140 may provide a message of the information about the FRU of the node to the RMC 150 through a network connection, so as to enable the RMC 150 to determine the types of the first node 121 to the fourteenth node 134. Thereafter, the RMC 150 informs the detecting unit 140 of the types of the nodes. Next, according to the types of the nodes, the detecting unit 140 acquires sensor read values and corresponding version information of the first node 121 to the fourteenth node 134 with a corresponding sensor reading method (through the IPMI or by adopting the master_write_read command). Then, the RMC 150 acquires the sensor read values and the corresponding version information of the first node 121 to the fourteenth node 134 stored in the detecting unit 140. Thereafter, according to the types and the sensor read values of the first node 121 to the fourteenth node 134, the RMC 150 performs power consumption statistics and power distribution on the nodes 121-134 (from the first node 121 to the fourteenth node 134).

For example, when the nodes 121-134 (from the first node 121 to the fourteenth node 134) are all high power consumption motherboards of 1,000 Watt (W), the RMC 150 acquires the sensor read values and the corresponding version information of the nodes through the detecting unit 140, and executes power matching calculation. Therefore, the RMC 150 may in advance calculate that the total power consumption is 14,000 W, and determine that the total power consumption is larger than a preset power value 10,000 W of the power supply of the rack system 100. When the activation switches of the first node 121 to the fourteenth node 134 are all pressed to send an enabling signal, the RMC 150 limits the number of activated ones of the nodes 121-134 (from the first node 121 to the fourteenth node 134) according to a calculation result of the total power consumption, so that the total power consumption thereof is maintained below the preset power value 10,000 W. Therefore, the RMC 150 may only allow the nodes from the first node 121 to a tenth node 130 to be turned on, such that the total, power consumption does not exceed 10,000 W. Meanwhile, the RMC 150 may control a fan rotation speed or activate a heat sink device according to heat energy generated by current power consumption, so as to regulate the temperature of the rack system 100.

It should be noted that, the rack system 100 may further include a plurality of detecting units (not shown). For example, the rack system 100 may include five detecting units, in which each detecting unit may be connected to seven chassis, that is, fourteen nodes in total. Therefore, in this embodiment, the rack system 100 may include seventy nodes in total, and perform power distribution and fan rotation speed controlling through the RMC 150, so as to achieve real-time power management and temperature controlling of the rack system 100.

Figure 2:
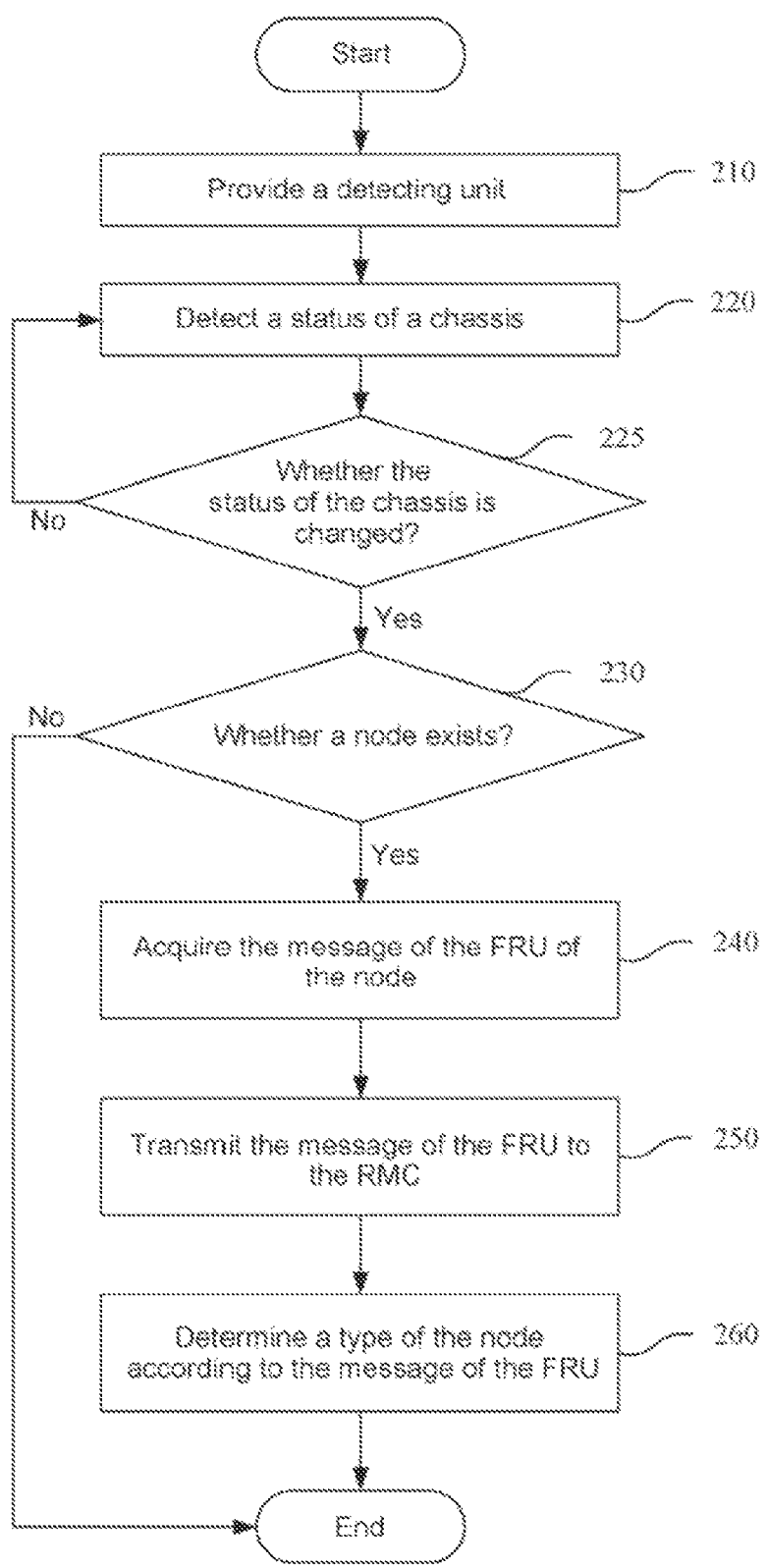
FIG. 2 is a schematic flowchart showing a controlling method for a rack system according to an embodiment of the present disclosure.

FIG. 2 is a schematic flowchart showing a controlling method for a rack system according to an embodiment of the present disclosure. The controlling method may be applied to the rack system 100 shown in FIG. 1, and include the following operation steps. In Step 210, at least one detecting unit 140 is provided, and is connected to the RMC 150 and the nodes 121-134 (from the first node 121 to the fourteenth node 134) corresponding to the chassis 111-117 (from the first chassis 111 to the seventh chassis 117) in the rack system 100. Next, in Step 220, the detecting unit 140 detects status messages of the chassis 111-117 (from the first chassis 111 to the seventh chassis 117). In Step 225, the detecting unit 140 may determine whether statuses of the chassis 111-117 (from the first chassis 111 to the seventh chassis 117) are changed according to a detection result. For example, the detecting unit 140 may detect and determine a status message about whether any one of the chassis 111-117 (from the first chassis 111 to the seventh chassis 117) is removed from the rack system 100, or whether any one of the chassis 111-117 (from the first chassis 111 to the seventh chassis 117) is a newly added chassis in the rack system 100, and may send a corresponding status command to the RMC 150, so as to notify the RMC 150 that a status of a chassis in the chassis 111-117 (from the first chassis 111 to the seventh chassis 117) has been changed. When a status of any one of the chassis 111-117 (from the first chassis 111 to the seventh chassis 117) is changed, the detecting unit 140 may determine whether a node corresponding to the chassis of which the status is changed exists in the rack system 100 according to the status message of the chassis, as shown in Step 230. For example, when a board is newly added to or removed from the slots corresponding to the chassis 111-117 (from the first chassis 111 to the seventh chassis 117), the detecting unit 140 may determine whether a node is newly added into or removed from the chassis according to status messages of the chassis 111-117 (from the first chassis 111 to the seventh chassis 117). When any one of the nodes 121-134 (from the first node 121 to the fourteenth node 134) exists, the detecting unit 140 may acquire the message of the FRU of the node, as shown in Step 240. Thereafter, in Step 250, the detecting unit 140 may transmit the acquired message of the FRU to the RMC 150. Afterward, in Step 260, the RMC 150 may determine a type of the existing node according to the message of the FRU.

In an embodiment, the type of the node may include at least one of an LAN switch, a JBOD and a motherboard, in which the JBOD may include a processor, and the motherboard may include a BMC.

Figure 3:
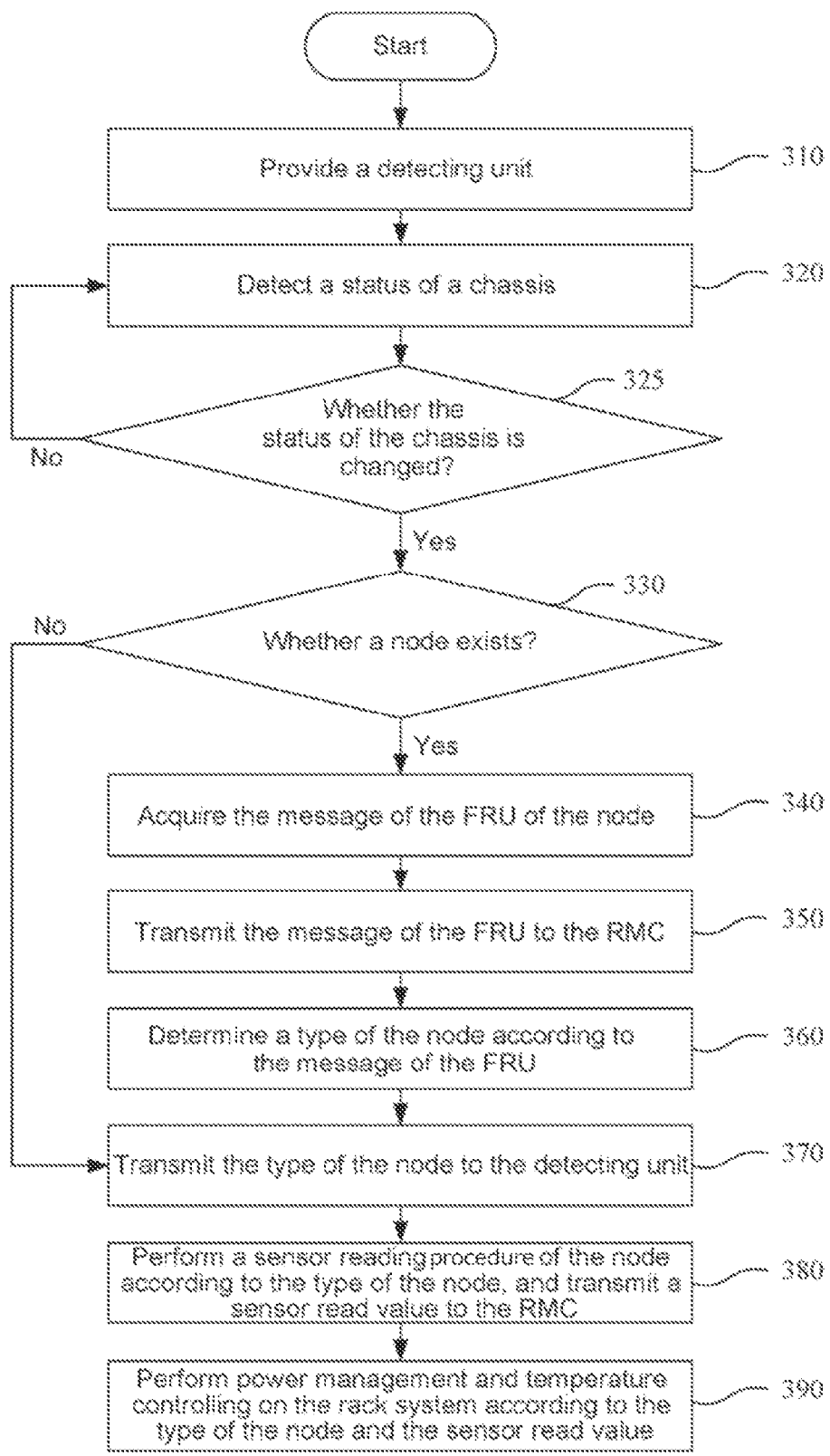
FIG. 3 is a schematic flowchart showing a controlling method for a rack system according to an embodiment of the present disclosure.

FIG. 3 is a schematic flowchart showing a controlling method for a rack system according to an embodiment of the present disclosure. The controlling method may be applied to the rack system 100 shown in FIG. 1, and Steps 310 to 360 of this embodiment are the same as or similar to Steps 210 to 260 of the foregoing embodiment, and thus are not described again herein. In Step 370, a determination result of the type of the node may be transmitted to the detecting unit 140 through the RMC 150, and the detecting unit 140 is informed of the type of the node and of a sensor reading method of the node through a node type command. For example, when the RMC 150 determines that the nodes from the first node 121 to the tenth node 130 are motherboard nodes and the nodes from the eleventh node 131 to the fourteenth node 134 are LAN switches, the RMC 150 transmits this determination result of the types of the nodes back to the detecting unit 140. Next, in Step 380, the detecting unit 140 may perform a sensor reading procedure of each of the nodes from the first node 121 to the fourteenth node 134 according to the type of the node, and transmit a sensor read value to the RMC 150, and provide a sensor reading command to the RMC 150, so that the RMC 150 may acquire the sensor read value of the node stored in the detecting unit 140 through the IPMI. Thereafter, in Step 390, the RMC 150 may perform power management and temperature controlling on the rack system 100 according to the type of the node and the sensor read value. That is, the RMC 150 may determine whether the total power consumption exceeds a load of the power supply according to power consumption corresponding to different types of the nodes and activation statuses of the nodes, so as to determine whether the number of activated ones of the first node 121 to the fourteenth node 134 should be limited to maintain certain power consumption. Moreover, the RMC 150 may control the fan rotation speed and the heat sink device according to generated heat energy corresponding to the total power consumption of the nodes, so as to regulate the temperature of the rack system 100.

When it is determined in Step 330 that the node does not exist, that is, the board corresponding to the node has been withdrawn from the rack system 100, in this case, the detecting unit 140 may directly provide information that the node does not exist to the RMC 150. Therefore, the detecting unit 140 and the RMC 150 may omit the delivery of the message of this node, and acquire and determine status messages of other nodes, but the present disclosure is not limited to the operation sequence of the aforementioned embodiment.

Figure 4:
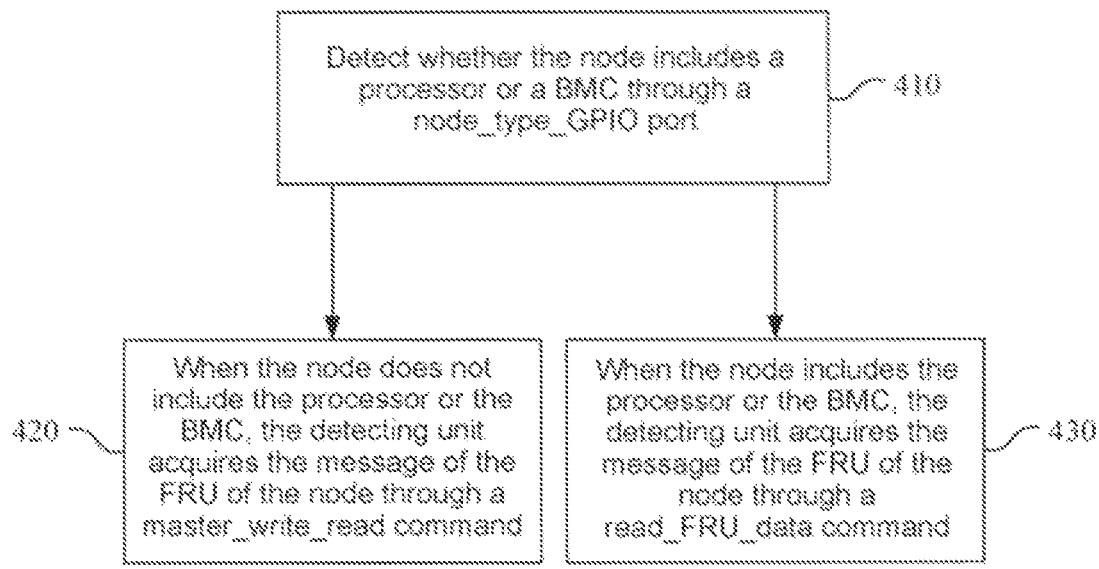
FIG. 4 is a schematic flowchart showing the step of acquiring a message of an FRU of a node according to an embodiment of the present disclosure.

FIG. 4 is a schematic flowchart showing the step of acquiring a message of an FRU of a node in Step 240 and/(or Step 340 according to an embodiment of the present disclosure. In sub-step 410, the detecting unit 140 may detect whether the node includes a processor or a BMC through a node_type_GPIO port. When the node does not include the processor or the BMC, the detecting unit 140 may acquire the message of the FRU of the node through a master_write_read command, as shown in sub-step 420. When the node includes the processor or the BMC, the detecting unit 140 may acquire the message of the FRU of the node through a read_FRU_data command, as shown in sub-step 430.

Figure 5:
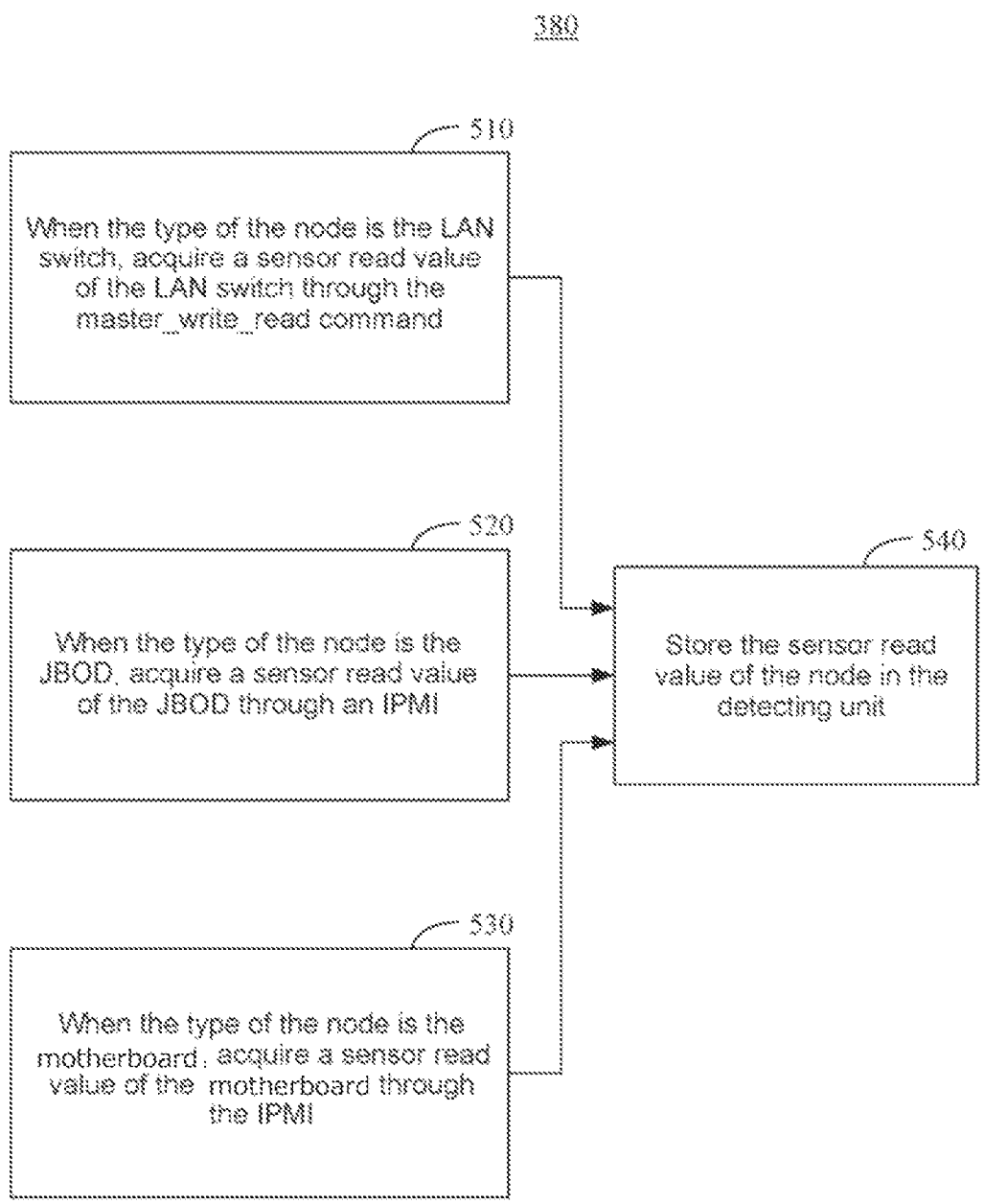
FIG. 5 is a schematic flowchart showing the step of performing a sensor to reading procedure of a node according to an embodiment of the present disclosure.

FIG. 5 is a schematic flowchart showing the step of performing a sensor reading procedure of a node in Step 380 according to an embodiment of the present disclosure. In sub-step 510, when the type of the node is the LAN switch, the detecting unit 140 may acquire a sensor read value of the LAN switch through the master_write_read command. When the type of the node is the JBOD, the detecting unit 140 may acquire a sensor read value of the JBOD through an IPMI, as shown in Sub-step 520. When the type of the node is the motherboard, the detecting unit 140 may acquire a sensor read value of the motherboard through the BMC of the motherboard and by using the IPMI, as shown in Sub-step 530. Then, in Step 540, the sensor read value of the node may be stored in the detecting unit 140, so as to be read by the RMC 150.

It should be noted that, in this embodiment, the type of the node may further include other types of controlling boards or equivalent devices, and is not limited to the aforementioned types.

Figure 6:
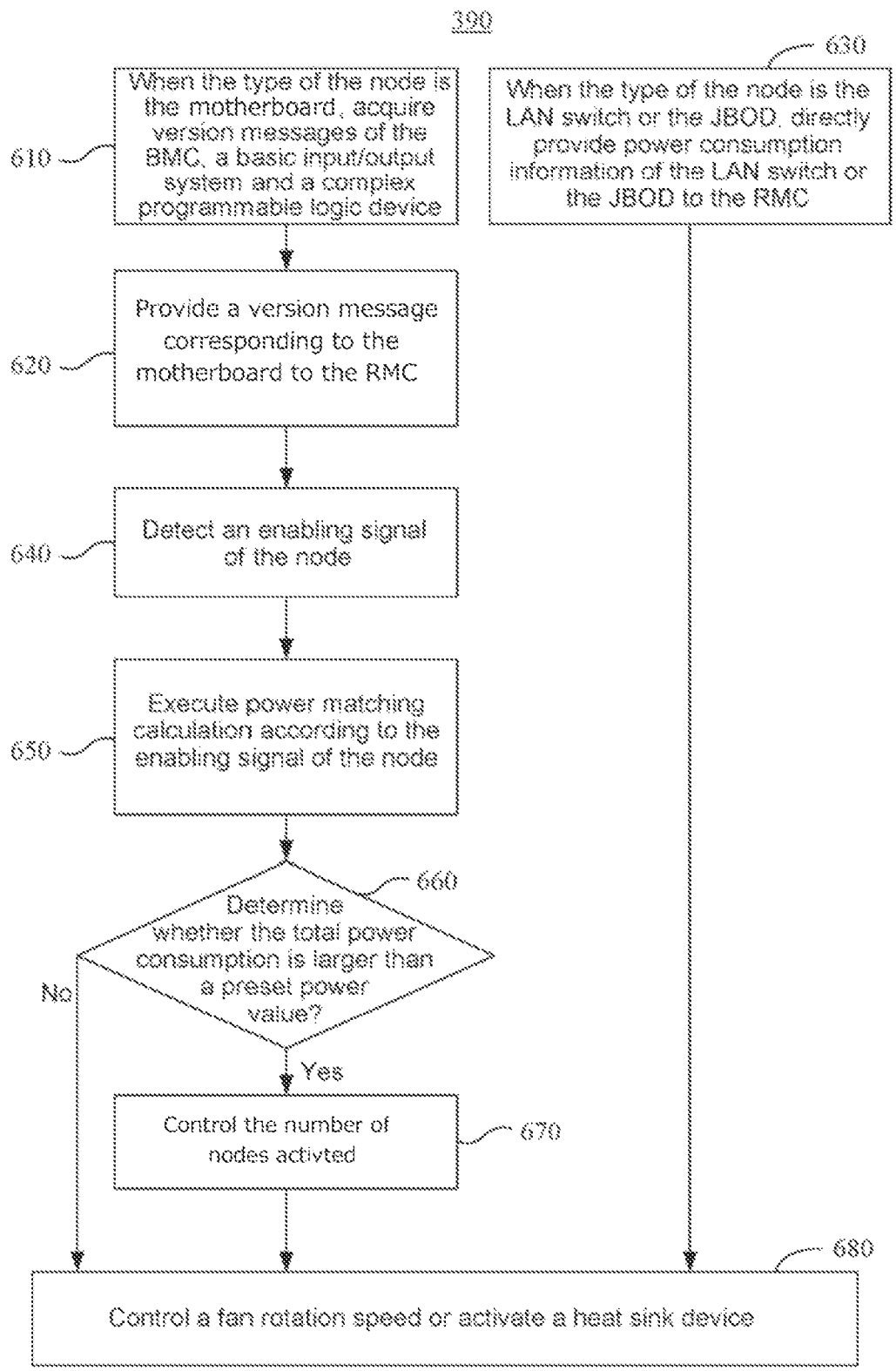
FIG. 6 is a schematic flowchart showing the step of performing power management and temperature controlling on a rack system according to an embodiment of the present disclosure.

FIG. 6 is a schematic flowchart showing the step of performing power management and temperature controlling on the rack system 100 in Step 390 according to an embodiment of the present disclosure. When the type of the node is the motherboard having power consumption of 1,000 W, the detecting unit 140 acquires version messages of the BMC, a basic input/output system and a complex programmable logic device of the motherboard, as shown in Step 610. Then, in Step 620, the detecting unit 140 provides a version message corresponding to the motherboard to the RMC 150.

In an embodiment, the step of performing the power management and the temperature controlling on the rack system 100 further includes the following steps. In Step 640, an enabling signal of the node is detected. That is, whether the node is turned on is detected. When the activation switches of the nodes from the first node 121 to the fourteenth node 134 are enabled, the nodes from the first node 121 to the fourteenth node 134 generate fourteen enabling signals which are delivered to the RMC 150 through the detecting unit 140. Then, in Step 650, the RMC 150 may execute power matching calculation according to the enabling signal of each of the nodes, so as to perform statistics on total power consumption of the nodes. For example, when the nodes from first node 121 to the fourteenth node 134 are all motherboards having power consumption of 1,000 W, the RMC 150 may calculate and obtain that the total power consumption is 14,000 W. Thereafter, Step 660 is performed to determine whether the total power consumption is larger than a preset power value. For example, the RMC 150 may determine that the total power consumption 14,000 W of the nodes from the first node 121 to the fourteenth node 134 is larger than the preset power value 10,000 W of the power supply. When the total power consumption is larger than the preset power value, the RMC 150 may control the number of the activated nodes and maintain a load of the power supply, so as to perform the power management on the rack system 100. That is, the RMC 150 may only allow the nodes from the first node 121 to the tenth node 130 to be turned on, such that the total power consumption does not exceed 10,000 W, so as to maintain the load of the power supply, as shown in Step 670.

When the type of the node is the LAN switch or the JBOD having low power consumption, the detecting unit 140 may directly provide power consumption information corresponding to the LAN switch or the JBOD to the RMC 150, as shown in sub-step 630. Then, the LAN switch and the JBOD in the rack system 100 may be directly activated without needing to perform the power matching calculation.

In sub-step 680, the RMC 150 may control a fan rotation speed or activate a heat sink device according to the number of the currently activated nodes and the correspondingly generated heat energy, so as to regulate the temperature of the rack system 100. For example, when the number of the activated nodes is changed from originally two to ten, the total power consumption is increased from originally 2,000 W to 10,000 W. In this case, the RMC 150 may control the fan rotation speed to be increased from originally 800 revolutions per minute (RPM) to 4,000 RPM according to heat energy generated by the power consumption, so as to improve heat dissipation capability, and regulate the temperature of the rack system 100.

Figure 7:
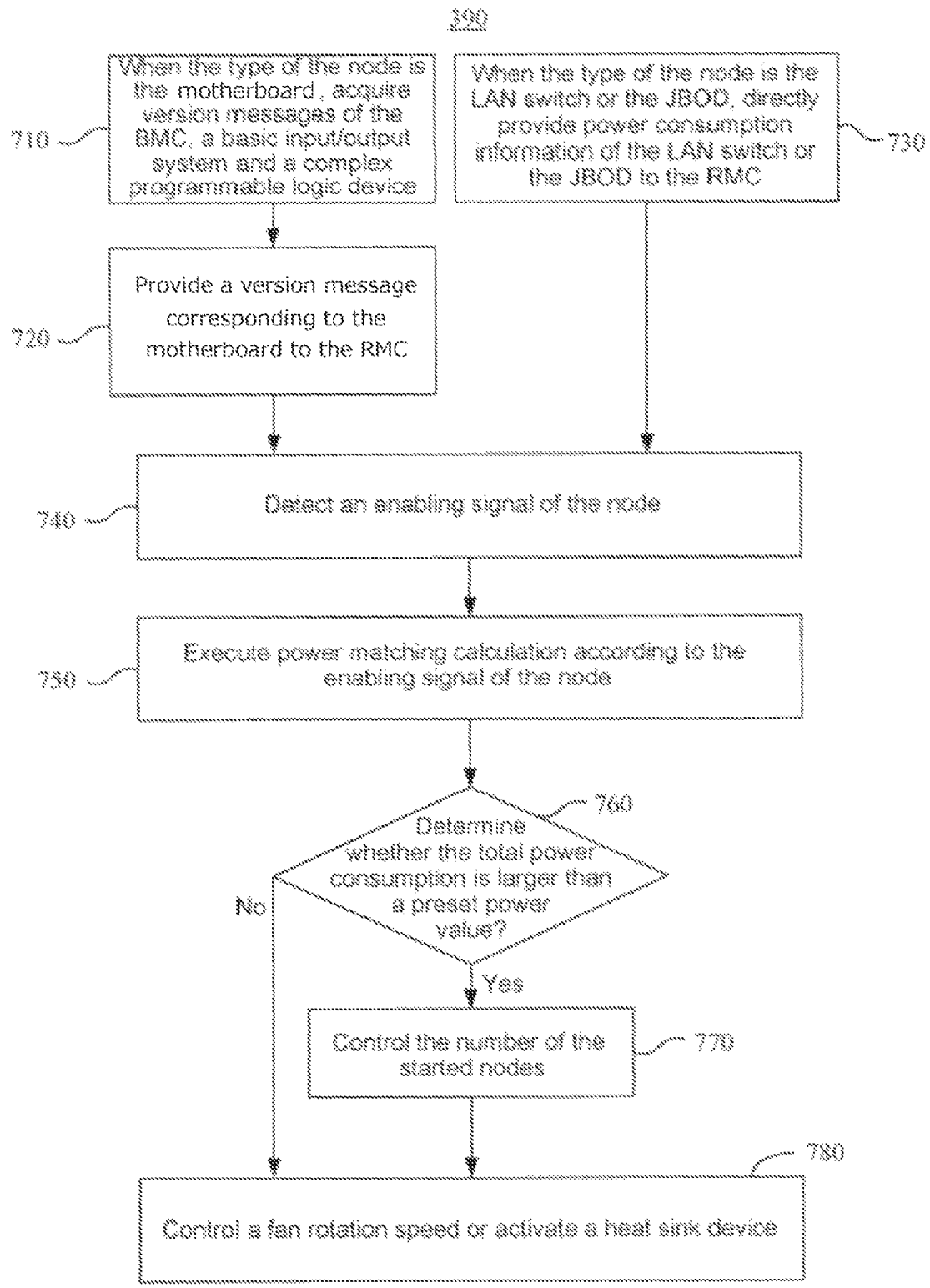
FIG. 7 is a schematic flowchart showing the step of performing power management and temperature controlling on a rack system according to an embodiment of the present disclosure.

Alternatively, refer to FIG. 7. FIG. 7 is a schematic flowchart showing the step of performing power management and temperature controlling on the rack system 100 in Step 390 according to an embodiment of the present disclosure. Sub-steps 710 to 730 are the same as or similar to sub-steps 610 to 630, and are not described again herein. Thereafter, in sub-step 740, the detecting unit 140 may detect an enabling signal when the node is a motherboard, an LAN switch or a JBOD. When the activation switches of the nodes from the first node 121 to the fourteenth node 134 are enabled, the nodes from the first node 121 to the fourteenth node 134 generate fourteen enabling signals, and the enabling signals of the nodes are delivered to the RMC 150 through the detecting unit 140. Then, the RMC 150 may execute power matching calculation according to the number of the activated nodes, so as to perform statistics on total power consumption of the nodes, as shown in sub-step 750. For example, when the nodes from the first node 121 to the fourteenth node 134 are all LAN switches having power consumption of 100 W, the RMC 150 may calculate and obtain that the total power consumption is 1,400 W. Then, in sub-step 760, the RMC 150 may determine whether the total power consumption is larger than a preset power value. For example, the RMC 150 may determine that the total power consumption 1,400 W is not larger than the preset power value 10,000 W. Therefore, the RMC 150 may allow the nodes from the first node 121 to the fourteenth node 134 all to be activated, as shown in sub-step 770.

Thereafter, in sub-step 780, the RMC 150 may control a fan rotation speed or activate a heat sink device according to the number of the activated nodes and the correspondingly generated heat energy, so as to regulate the temperature of the rack system 100. For example, when the total power consumption of the nodes is reduced from originally 10,000 W to 1,400 W, heat energy generated in the rack system 100 is reduced accordingly, and thus the RMC 150 may control the fan rotation speed to be reduced from originally 4,000 RPM to 560 RPM, so as to correspondingly regulate the temperature of the rack system 100.

Compared with the prior art, in the embodiments of the present disclosure, the detecting unit detects and determines a status message and a sensor read value of a newly added node in the rack system, so that the RMC may determine the type of the node in real time and correspondingly perform power matching calculation, so as to perform power consumption statistics and power distribution on all nodes in the rack system, and execute corresponding temperature regulation according to generated heat energy corresponding to activated nodes, thereby achieving the function of real-time power management and temperature controlling, and the present disclosure may be widely applied to a server and a cloud computing system.

Unless the sequence of steps and sub-steps thereof mentioned in the present disclosure is illustrated particularly, the steps and the sub-steps thereof may adjust the sequence as required practically, and even may be executed simultaneously or partially simultaneously, and the present disclosure is not limited to the foregoing sequence.

Although the present disclosure is disclosed with reference to embodiments above, the embodiments are not intended to limit the present disclosure. Various variations and modifications can be made by persons skilled in the art without departing from the spirit and the scope of the present disclosure, so the protection scope of the present disclosure should be subject to what is defined in appended claims.

What is claimed is:

1. A method for controlling a rack system which is applied to a rack system comprising a plurality of detachable chassis, wherein at least one node is disposed in the chassis, and a rack management controller (RMC) is disposed in the rack system, and the controlling method comprises:
    providing at least one detecting unit, wherein the detecting unit is connected to the RMC and the node of the chassis in the rack system;
    detecting, by the detecting unit, a status message of the chassis for determining whether a status of the chassis is changed;
    when the status of the chassis is changed, determining, by the detecting unit, according to the status message of the chassis, whether the node corresponding to the chassis exists in the rack system;
    when the node exists, acquiring, by the detecting unit, a message of a field replaceable unit (FRU) of the node;
    transmitting, by the detecting unit, the message of the FRU to the RMC; and
    determining, by the RMC, a type of the node according to the message of the FRU.

2. The controlling method for a rack system of claim 1, further comprising:
   transmitting, by the RMC, the type of the node to the detecting unit;
   performing, by the detecting unit, a sensor reading procedure of the node according to the type of the node, and transmitting a sensor read value to the RMC; and
   performing, by the RMC, power management and temperature controlling on the rack system according to the type of the node and the sensor read value.

3. The controlling method for a rack system of claim 2, wherein the step of transmitting the type of the node to the detecting unit comprises:
   informing the detecting unit of the type of the node and of a sensor reading method of the node through a node type command.

4. The controlling method for a rack system of claim 2, wherein the step of transmitting the sensor read value to the RMC comprises:
   providing a sensor reading command to the RMC, so as to acquire the sensor read value of the node stored in the detecting unit.

5. The controlling method for a rack system of claim 1, wherein the type of the node comprises at least one of an LAN switch, a Just a Bunch of Disks (JBOD) and a motherboard, the JBOD comprises a processor, and the motherboard comprises a Baseboard Management Controller (BMC).

6. The controlling method for a rack system of claim 5, wherein the step of acquiring the message of the FRU of the node comprises:
   detecting, by the detecting unit, whether the node includes a processor or a BMC through a node_type_GPIO (General Purpose I/O) port;
   when the node does not include the processor or the BMC, acquiring, by the detecting unit, the message of the FRU of the node through a master_write_read command; and
   when the node includes the processor or the BMC, acquiring, by the detecting unit, the message of the FRU of the node through a read_FRU_data command.

7. The controlling method for a rack system of claim 6, wherein the sensor reading procedure of the node comprises:
   when the type of the node is the LAN switch, acquiring, by the detecting unit, a sensor read value of the LAN switch through the master_write_read command;
   when the type of the node is the JBOD, acquiring, by the detecting unit, a sensor read value of the JBOD through an Intelligent Platform Management Interface (IPMI);
   when the type of the node is the motherboard, acquiring, by the detecting unit, a sensor read value of the motherboard through the IPMI; and
   storing the sensor read value of the node in the detecting unit.

8. The controlling method for a rack system of claim 5, wherein the step of performing the power management and the temperature controlling on the rack system comprises:
   when the type of the node is the motherboard, acquiring, by the detecting unit, version messages of the BMC, a basic input/output system and a complex programmable logic device of the motherboard;
   providing, by the detecting unit, a version message corresponding to the motherboard to the RMC; and
   when the type of the node is the LAN switch or the JBOD, directly providing, by the detecting unit, power consumption information of the LAN switch or the JBOD to the RMC.

9. The controlling method for a rack system of claim 8, wherein the step of performing the power management and the temperature controlling on the rack system further comprises:
   detecting an enabling signal of the node;
   executing power matching calculation according to the enabling signal of the node, so as to perform statistics on total power consumption of the node;
   determining whether the total power consumption is larger than a preset power value; and
   when the total power consumption is larger than the preset power value, controlling the number of nodes activated to maintain a load of a power supply, so as to perform the power management on the rack system.

10. The controlling method for a rack system of claim 9, wherein the RMC controls a fan rotation speed or activates a heat sink device according to generated heat energy corresponding to the number of the nodes activated, so as to regulate a temperature of the rack system.

* * * * *